(12) United States Patent
Nomura et al.

(10) Patent No.: US 9,333,905 B2
(45) Date of Patent: May 10, 2016

(54) LIGHT EMITTING MODULE

(71) Applicant: KOITO MANUFACTURING CO., LTD., Tokyo (JP)

(72) Inventors: Akihiro Nomura, Shizuoka (JP); Shogo Sugimori, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 198 days.

(21) Appl. No.: 14/155,631

(22) Filed: Jan. 15, 2014

(65) Prior Publication Data

US 2014/0211449 A1   Jul. 31, 2014

(30) Foreign Application Priority Data

Jan. 30, 2013   (JP) ................. 2013-015618

(51) Int. Cl.
| | |
|---|---|
| *F21V 9/00* | (2015.01) |
| *B60Q 1/30* | (2006.01) |
| *B60Q 1/38* | (2006.01) |
| *F21S 8/10* | (2006.01) |
| *H01L 25/075* | (2006.01) |
| *H01L 33/50* | (2010.01) |

(52) U.S. Cl.
CPC *B60Q 1/302* (2013.01); *B60Q 1/38* (2013.01); *F21S 48/211* (2013.01); *F21S 48/215* (2013.01); *F21S 48/218* (2013.01); *F21S 48/2243* (2013.01); *B60Q 2400/10* (2013.01); *B60Q 2400/30* (2013.01); *H01L 25/0753* (2013.01); *H01L 33/50* (2013.01); *H01L 2924/0002* (2013.01); *H01L 2933/0091* (2013.01)

(58) Field of Classification Search
CPC ........... B60Q 1/302; B60Q 1/38; F21K 3/00; F21K 9/30; F21V 9/16
USPC ........................... 362/235, 84, 231
See application file for complete search history.

(56) References Cited

U.S. PATENT DOCUMENTS

| | | | | |
|---|---|---|---|---|
| 7,273,300 B2 * | 9/2007 | Mrakovich | ............ | F21S 4/005 362/235 |
| 7,997,749 B2 * | 8/2011 | Kim | ............ | F21K 9/00 362/249.02 |
| 8,147,092 B2 * | 4/2012 | Wu | ............ | F21S 10/02 362/231 |
| 8,272,758 B2 * | 9/2012 | Meir | ............ | G02B 6/0021 362/230 |
| 2009/0296389 A1 * | 12/2009 | Hsu | ............ | G02F 1/133603 362/235 |
| 2014/0160752 A1 * | 6/2014 | Cornelissen | ............ | H01L 25/0753 362/235 |

FOREIGN PATENT DOCUMENTS

WO   2010150459   12/2010

* cited by examiner

*Primary Examiner* — Anabel Ton
(74) *Attorney, Agent, or Firm* — Abelman, Frayne & Schwab

(57) ABSTRACT

The light emitting module includes a plurality of light emitting elements; a fluorescent substance resin layer containing a fluorescent substance which is excited by light emitted from the plurality of light emitting elements to emit visible light; a reflective surface configured to reflect light emitted from the plurality of light emitting elements and the fluorescent substance resin layer; and a light guiding body layer provided between the reflective surface and the fluorescent substance resin layer, and configured to guide light emitted from the plurality of light emitting elements or the fluorescent substance.

13 Claims, 12 Drawing Sheets

LIGHT EMITTING MODULE

CROSS-REFERENCE TO RELATED APPLICATIONS

This application is based on and claims priority from Japanese Patent Application No. 2013-015618, filed on Jan. 30, 2013 with the Japan Patent Office, the disclosure of which is incorporated herein in its entirety by reference.

TECHNICAL FIELD

The disclosure relates to a light emitting module using a fluorescent substance, and particularly to a light emitting module using a fluorescent substance that is excited by UV rays or short wavelength visible light to emit light.

BACKGROUND

WO Publication No. 2010/150459 discloses a light emitting module in which a plurality of semiconductor light emitting elements formed of LEDs are arrayed on a support substrate, and each of the semiconductor light emitting elements is integrally covered with a fluorescent substance resin layer such that the surface of a fluorescent substance resin layer emits light.

SUMMARY

In the light emitting module, semiconductor light emitting elements emitting light with high directivity are used, and thus most of the emitted light is released in a predetermined direction. Accordingly, when the interval between the arrayed semiconductor light emitting elements is wide, contrast difference between a bright part and a dark part increases, and as a result, uniformity becomes poor. When the semiconductor light emitting elements are arrayed with a narrow interval in order to remove the contrast difference, the number of elements increases, thereby increasing the cost. Further, due to the heat generation from the semiconductor light emitting elements, reliability of the light emitting module reduces.

Accordingly, an object of the present disclosure is to provide a light emitting module by which both uniform light emission and low cost may be achieved.

In order to achieve the object, the light emitting module of the present disclosure includes a plurality of light emitting elements; a fluorescent substance resin layer containing a fluorescent substance which is excited by light emitted from the plurality of light emitting elements to emit visible light; a reflective surface configured to reflect light emitted from the plurality of light emitting elements and the fluorescent substance resin layer; and a light guiding body layer provided between the reflective surface and the fluorescent substance resin layer, and configured to guide light emitted from the plurality of light emitting elements or the fluorescent substance.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the light emitting module of the present disclosure, the light guiding body layer may have a different refractive index from the fluorescent substance resin layer.

The light guiding body layer may be made of a material having a higher refractive index than the fluorescent substance resin layer.

The plurality of light emitting elements may be provided within the light guiding body layer.

At least a part of each of the plurality of light emitting elements may be positioned within the fluorescent substance resin layer.

The light emitting module of the present disclosure may further include a scattering processing unit provided on at least one of the reflective surface and an interface between the fluorescent substance resin layer and the light guiding body layer, the scattering processing unit being processed to scatter a part of the light emitted from the plurality of light emitting elements.

In the light emitting module of the present disclosure, the plurality of light emitting elements may be disposed in a predetermined two-dimensional shape, and formed to be connected in line by at least one of the fluorescent substance resin layer and the light guiding body layer.

According to the present disclosure, the light emitted from the respective light emitting elements is reflected at the interface between the light guiding body layer and the fluorescent substance resin layer by the light guiding body layer provided between the reflective surface and the fluorescent substance resin layer, and thus may be diffused to be spread around the light emitting elements. Thus, even though the interval between the light emitting elements mounted in the light emitting module is widened, substantially uniform light emission with a small contrast difference may be obtained.

(First Exemplary Embodiment)

Figure 1:
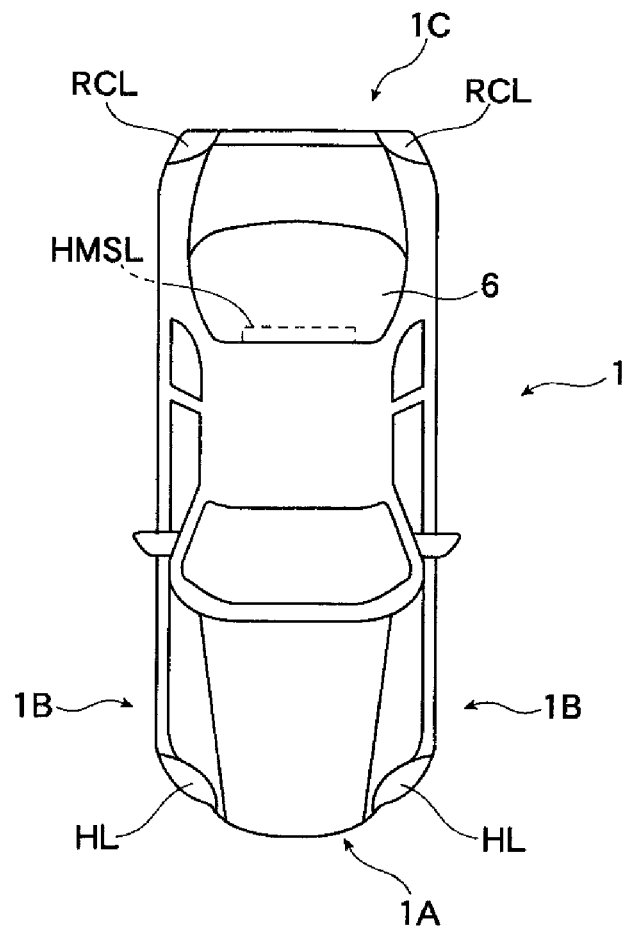
FIG. 1 is a plan view of a vehicle provided with a vehicle lamp formed of a light emitting module according to an exemplary embodiment of the present disclosure.

Hereinafter, an exemplary embodiment of the present disclosure will be described with reference to drawings. FIG. 1 is a plan view of a vehicle provided with a vehicle lamp formed of a light emitting module according to an exemplary embodiment of the present disclosure.

A vehicle 1 is provided with head lamps HLs at the left and right sides of a vehicle body front portion 1A thereof, and with rear combination lamps RCLs each of which accommodates a tail lamp, a stop lamp, a turn signal lamp and a backup at the left and right sides of a vehicle body rear portion 1C thereof. In the HL of the vehicle 1, a beacon light 200 formed of a light emitting module 20 according to a first exemplary embodiment of the present disclosure is accommodated. The beacon light 200 is mainly used as a daytime running lamp but may be accommodated in the RCL to be used as a turn signal lamp, or a stop lamp besides the daytime running lamp. A high mount stop lamp (HMSL) 300 formed of a light emitting module 30 to be described later is arranged at a central upper portion of a back window 6 of the vehicle 1. The vehicle body front portion 1A of the vehicle 1 has a central portion convexly formed in a round shape, and has a complicated curved shape.

Figure 2:
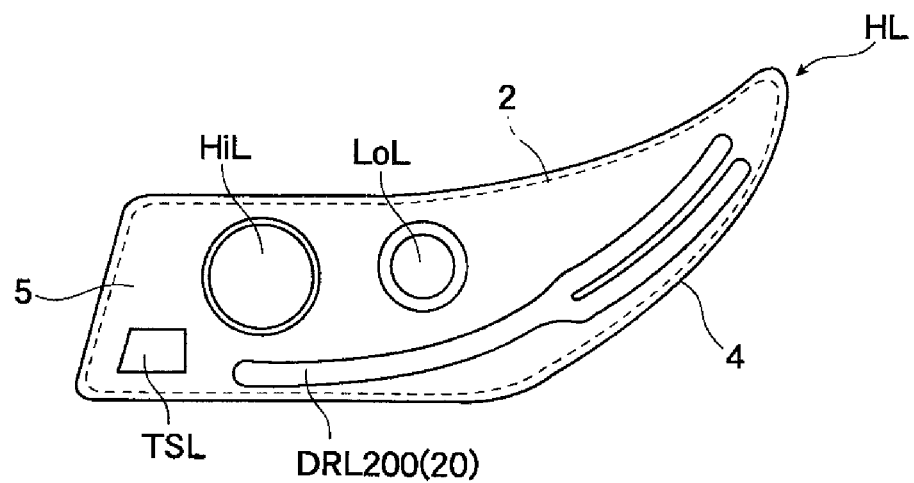
FIG. 2 is a front view of a headlight including a beacon light formed of a light emitting module according to a first exemplary embodiment of the present disclosure.
Figure 3:
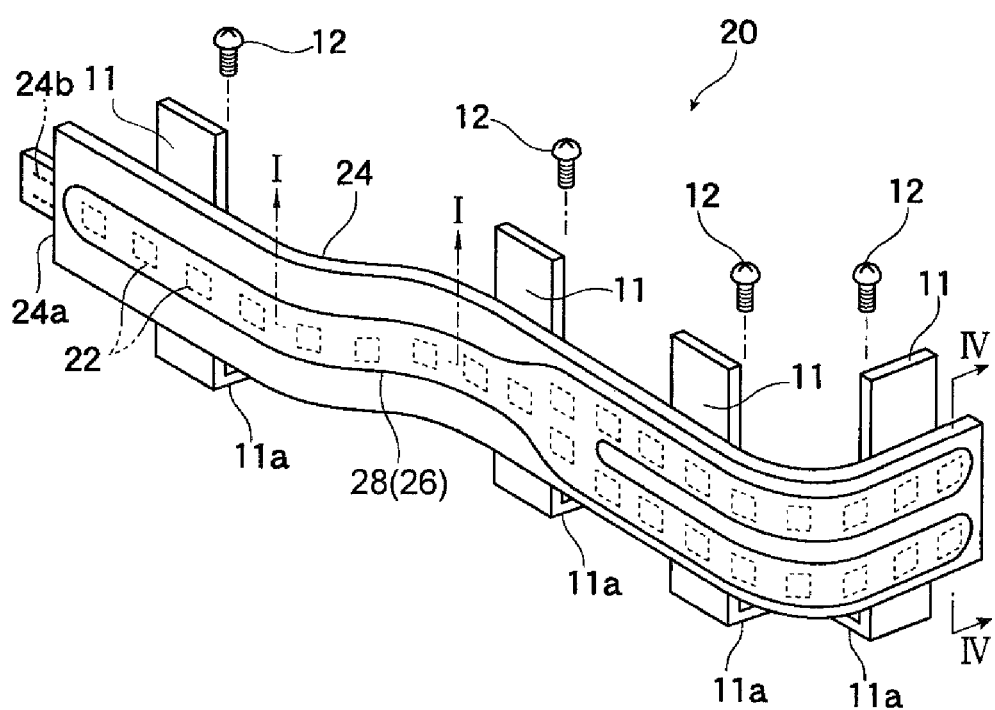
FIG. 3 is a perspective view of the beacon light illustrated in FIG. 1.
Figure 4:
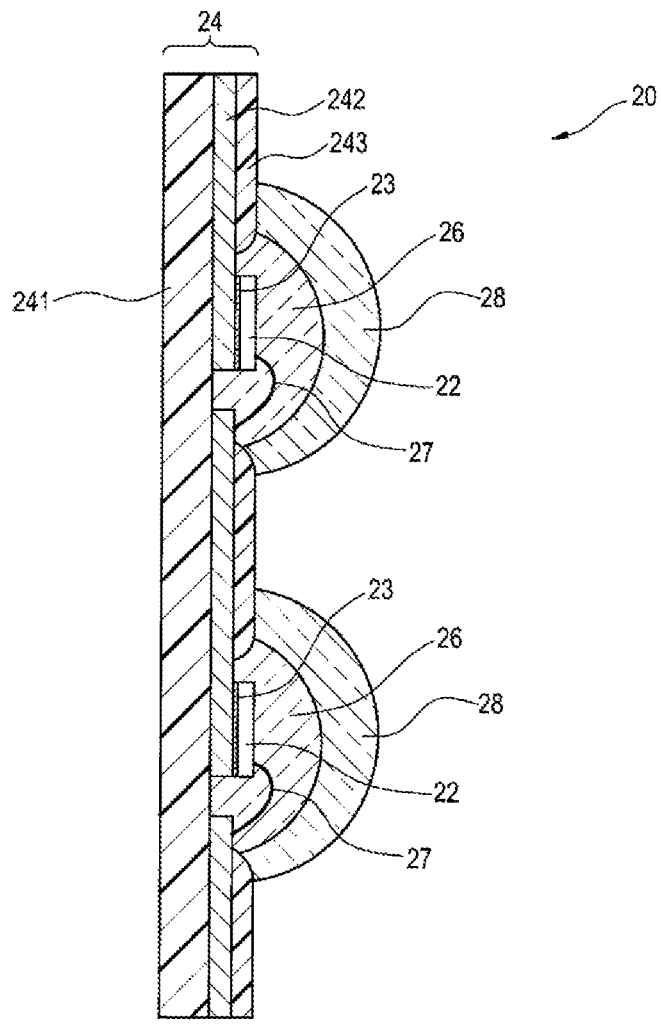
FIG. 4 is an exploded cross-sectional view of the light emitting module illustrated in FIG. 3 taken along line IV-IV.

FIG. 2 is a front view of a HL including a beacon light formed of a light emitting module according to a first exemplary embodiment, FIG. 3 is a perspective view of the beacon light according to the present exemplary embodiment, and FIG. 4 is a vertically cross-sectional view of the beacon light according to the present exemplary embodiment (cross-sectional view taken along line IV-IV of FIG. 3). In FIG. 2, the inside of a lamp chamber seen through a translucent cover 4 is indicated by a solid line.

In the HL, within the lamp chamber defined by a container-shaped lamp body 2 and the transparent translucent cover 4, when viewed from the front side, a low beam lamp (LoL) is arranged at right, a high beam lamp (HiL) is arranged at left, and a turn signal lamp (TSL) is arranged abreast at the further left side. In a region below the LoL and the HiL, the beacon light 200 formed of the light emitting module 20 is arranged. The lamp body 2, the translucent cover 4, and inside of the lamp chamber constituted by the lamp body 2, the translucent cover 4 are three-dimensionally formed to turn around along the streamlined shape of the vehicle body front portion 1A from the vehicle body front portion 1A to a vehicle body side portion 1B. Accordingly, the beacon light 200 within the lamp chamber is also disposed to extend according to the curved shape in horizontal direction within the lamp chamber. The LoL, the HiL and the beacon light 200 are configured such that their fixed parts or electric wirings are not visually recognized from the lamp front side due to an extension 5 arranged within the lamp chamber.

Hereinafter, the light emitting module 20 that constitutes the beacon light 200 will be described in detail. The light emitting module 20 includes light emitting elements 22, a flexible printed circuit board (FPC) 24, a light guiding body layer 26 configured to guide light from the light emitting elements 22, and a fluorescent substance resin layer 28 that contains a fluorescent substance.

The light emitting element 22 is an InGaN-based compound semiconductor which emits UV rays or short wavelength visible light that has a peak wavelength at a wavelength region of 370 nm to 420 nm, and for example, employs a LED chip of 1 mm square which emits light having a center wavelength of about 400 nm. The light emitting element 22 is not limited thereto, for example, a laser diode (LD) which emits UV rays or short wavelength visible light may be employed.

The FPC 24 is not only a planar wiring member of the light emitting element 22 but also a support substrate, and as illustrated in FIG. 4, is obtained by forming a conductive layer 242 made of, for example, a copper foil in a required electrode pattern on the surface of a laterally long insulating resin film 241, and covering the surface of the conductive layer 242 with an insulating coating film 243. A power supply terminal 24b is formed at one end portion 24a of the FPC 24 in a longitudinal direction. The power supply terminal 24b is fitted to a relay connector provided (not illustrated) in the lamp body 2 to be electrically connected, and an external power source (not illustrated) is supplied to the conductive layer 242 from the relay connector via the power supply terminal 24b, and supplied to the light emitting element 22 placed on the conductive layer 242. The light emitting element 22 is soldered on the FPC 24 [on the conductive layer 242 as an anode] by, for example, conductive silver paste 23, and is connected to the conductive layer 242 as a cathode through wire 27 to be conductive. Here, the top surface of the conductive layer 242 on which the light emitting element 22 is mounted forms a reflective surface 24c to be described below.

The light guiding body layer 26 is formed of a transparent resin which can guide light emitted from the light emitting element 22 or the fluorescent substance contained in the fluorescent substance resin layer 28. The transparent resin forming the light guiding body layer 26 is formed by, for example, a transparent resin paste made of a liquid or gel silicon resin, and the transparent resin paste covers the top surface and side surfaces of the light emitting element 22. In the present exemplary embodiment, it is desirable that a material for forming the light guiding body layer 26 has a different refractive index from a material for forming the fluorescent substance resin layer 28 provided on the top surface thereof. In particular, it is desirable that the material for forming the light guiding body layer 26 is has a larger refractive index than that for the fluorescent substance resin layer 28.

The fluorescent substance resin layer 28 is provided on the top surface of the light guiding body layer 26. The fluorescent substance resin layer 28 contains the fluorescent substance which is excited by light emitted from the light emitting element 22 to emit visible light. Specifically, the fluorescent substance resin layer 28 is prepared as a fluorescent substance paste, by mixing a yellow fluorescent substance and a blue fluorescent substance to be described later with each other in a weight ratio 2:1, and mixing the mixed fluorescent substance in an amount of 1.8 vol % with a binder material made of a liquid or gel silicon resin. The binder material is not limited thereto, but other materials excellent in UV resistant performance, such as fluorine resin, may be employed.

As for the yellow fluorescent substance, a substance which efficiently absorbs near ultraviolet light or short wavelength visible light, but hardly absorbs visible light at 450 nm or more is used. As for the yellow fluorescent substance, a fluorescent substance which emits yellow light through wavelength conversion of near ultraviolet light or short wavelength visible light, and has a dominant wavelength of the emitted light at a wavelength range of 564 nm to 582 nm is used. As for the yellow fluorescent substance, a fluorescent substance represented by $SiO_2 \cdot 1.0(Ca_{0.54}, Sr_{0.36}, Eu_{0.1})O \cdot 0.17SrCl_2$ is used. The yellow fluorescent substance is a fluorescent substance within which cristobalite is produced by adding an excess of $SiO_2$ in the mixing ratio of raw materials.

In preparation of the yellow fluorescent substance, first, respective raw materials of $SiO_2$, $Ca(OH)_2$, $SrCl_2 \cdot 6H_2O$ and $Eu_2O_3$ were weighed so that a mole ratio thereof is $SiO_2$:Ca$(OH)_2$:$SrCl_2 \cdot 6H_2O$:$Eu_2O_3$=1.1:0.45:1.0:0.13. Then, the respective weighed raw materials were put into an alumina mortar, and ground and mixed for about 30 min to obtain a raw material mixture. The raw material mixture was put in an alumina crucible and was fired in an electric furnace of reduction atmosphere at an atmosphere (5/95) of ($H_2/N_2$), 1030° C. for 5 h to 40 h to obtain a fired product. The obtained fired product was carefully washed with warm pure water to obtain a yellow fluorescent substance.

Materials for preparing the yellow fluorescent substance are not limited to the foregoing materials, but other materials represented by a general formula of $M^1O_2 \cdot a(M^2_{1-z}, M^4_z)O \cdot bM^3X_2$ may be employed. $M^1$ represents at least one kind of element selected from the group including Si, Ge, Ti, Zr and Sn. $M^2$ represents at least one kind of element selected from the group including Mg, Ca, Sr, Ba and Zn. $M^3$ represents at least one kind of element selected from the group including Mg, Ca, Sr, Ba and Zn. X represents at least one kind of halogen element, and $M^4$ represents at least one kind of element essentially including $Eu^{2+}$ which is selected from the group including rare earth elements and Mn. The value of "a" is in the range of $0.1 \leq a \leq 1.3$, "b" is in the range of $0.1 \leq b \leq 0.25$, and "z" is in the range of $0.03 \leq z \leq 0.8$. The yellow fluorescent substance employed in the present exemplary embodiment has a general formula in which $M^1$=Si, $M^2$=Ca/Sr (mole ratio 60/40), $M^3$=Sr, X=Cl, $M^4$=$Eu^{2+}$, a=0.9, b=0.17, c/(a+c)=0.1 (c (mole ratio) is content of $M^4$).

As for the yellow fluorescent substance, a fluorescent substance represented by $(Ca_{0.51}, Sr_{0.49})_{7/6}Si_3Cl_{2/6}$, or $(Re_{1-r}Sm_r)_2(Al_{1-s}Ga_s)_5O_{12}$:Ce ($0 \leq r \leq 1$, $0 \leq s \leq 1$, Re is at least one kind of element selected from the group including Y and Gd) may be used.

The blue fluorescent substance emits blue light through wavelength conversion of near ultraviolet light or short wavelength visible light. As for the blue fluorescent substance, a substance which efficiently absorbs near ultraviolet light or short wavelength visible light, and emits light having a dominant wavelength ranging from 440 nm to 470 nm is used. As for the blue fluorescent substance, a fluorescent substance represented by $(Ca_{4.67}Mg_{0.5})(PO_4)_3Cl$:$Eu_{0.08}$ is used.

The blue fluorescent substance is not limited thereto, but may be selected from the group of fluorescent substances represented by the following general formula.

General Formula $M^1a(M^2O_4)_bX_c$:$Re_d$ $M^1$ essentially includes at least one kind of element of Ca, Sr and Ba, and a part thereof may be substituted with an element selected from the group including Mg, Zn, Cd, K, Ag, and Ti. $M^2$ essentially includes P, and a part thereof may be substituted with an element selected from the group including V, Si, As, Mn, Co, Cr, Mo, W, and B. X represents at least one kind of halogen element, and Re represents at least one kind of earth element essentially including $Eu^{2+}$, or Mn. Here, the value of "a" is in the range of $4.2 \leq a \leq 5.8$, "b" is in the range of $2.5 \leq b \leq 3.5$, "c" is in the range of $0.8 < c < 1.4$, and "d" is in the range of $0.01 < d < 0.1$.

General Formula $M^1_{1-a}MgAl_{10}O_{17}$:$Eu^{2+}_a$ $M^1$ is at least one kind of element selected from the group including Ca, Sr, Ba, and Zn, and the value of "a" is in the range of $0.001 \leq a \leq 0.5$.

General Formula $M^1_{1-a}MgSi_2O_8$:$Eu^{2+}_a$ $M^1$ is at least one kind of element selected from the group including Ca, Sr, Ba, and Zn, and the value of "a" is in the range of $0.001 \leq a \leq 0.8$.

General Formula $M^1_{2-a}(B_5O_9)X$:$Re_a$ $M^1$ is at least one kind of element selected from the group including Ca, Sr, Ba, and Zn, X is at least one kind of halogen element, and the value of "a" is in the range of $0.001 \leq a \leq 0.5$.

As for the blue fluorescent substance, a fluorescent substance represented by $BaMgAl_{10}O_{17}$:Eu or $(Sr, Ca, Ba)_5(PO_4)_3Cl$:Eu may be used.

The fluorescent substance may include, besides the above exemplified yellow fluorescent substance and the blue fluorescent substance, one or a combination of two or more of a green fluorescent substance, a red fluorescent substance and an amber fluorescent substance.

The green fluorescent substance is a fluorescent substance which emits green light through wavelength conversion of near ultraviolet light or short wavelength visible light. As for the green fluorescent substance, a fluorescent substance represented by ZnS:Cu, Al, $BaMgAl_{10}O_{17}$:Eu, Mn or $ZnSiO_3$:Mn is used.

The red fluorescent substance is a fluorescent substance which emits red visible light through wavelength conversion of near UV rays or short wavelength visible light. As for the red fluorescent substance, a fluorescent substance represented by $Y_2O_2S$:Eu, $La_2O_2S$:Eu, (Sr, Ca)S:Eu, CaS:Eu, $Ba_2Zn_3$:Mn, $CaAlAiN_3$:Eu, $Sr_{0.95}Ca_{0.95}Eu_{0.1}SiO_4$, $Na_3(Y_{1-x}Eu_x)Si_2O_7$, $Ca_2SiS_4$:Eu, $Eu_2SiS_4$, $3.5MgO \cdot 0.5MgF_2 \cdot GeO_2$:Mn, or $M(Ga_{1-x}Eu_x)_2O_4$ (M is at least one kind of element selected from the group including Ca, Sr and Ba) is used.

The amber fluorescent substance is a fluorescent substance which emits amber visible light through wavelength conversion of near UV rays or short wavelength visible light. As for the amber fluorescent substance, a fluorescent substance represented by $Ca_3Si_2O_7$:Eu, $Sr_3SiO_5$:Eu, $(Sr_{1-x}Eu_{x(1-y)}Yb)O \cdot SiO_2$, $(Ba_aCa_bSr_cMg_dEu_xMn_y)SiO_4$, $(Sr_{1-x}Ba_x)_3SiO_5$, $(A, M)2SiO_4$ (A is at least one kind of element selected from the group including Ca, Sr and Ba, M is an activator), $(Ca_{1-y-z}Sr_yBa_z)_{2-x}Eu_xSiS_4$, $Ca_xSi_{12-(m+n)}Al_{(m+n)}O_nN_{16-n}$:Eu, $(Ca_{2-x-y-z}, M_xP_2O_7:Eu_y, Mn_z$ or $aRe_2O_3.[M]O.bAl_2O_3$:Eu is used.

Hereinafter, a method of forming the light emitting module 20 will be described.

First, the light emitting elements 22 are mounted in a straight line with a predetermined interval from the vehicle body front portion 1A side to the vehicle body side portion 1B side of the FPC 24, diverged into two branches at a wrap-around shaped position of the vehicle 1, and mounted to be arranged in two rows toward the vehicle body side portion 1B. Accordingly, the light emitting elements 22 are placed in plural numbers in a diverged two-dimensional shape on the surface of the FPC 24.

Subsequently, by using a dispenser of a 10 cc syringe (ejection port diameter φ1 mm), a transparent resin paste for forming the light guiding body layer 26 is applied on the respective light emitting elements 22 (through, for example, potting or printing). Specifically, the transparent resin paste is applied by moving a dispenser nozzle at a speed of about 10 mm/sec to integrally cover the light emitting elements 22 placed at a straight line portion and the upper branched portion. Then, the ejection of the transparent resin paste is stopped, and the dispenser is moved to the two-branch junction. The transparent resin paste is applied to integrally cover the light emitting elements 22 placed at the lower branched portion. Accordingly, the light emitting elements 22 are connected in line and sealed by the light guiding body layer 26 which has a cross-section formed in a hemispherical shape (a dome shape), and is molded in a substantially equal amount. Then, while such a dome shape is maintained, the light guiding body layer 26 is cured through heat treatment.

Likewise, subsequently, by using a dispenser, the light guiding body layer 26 is covered with a fluorescent substance paste for forming the fluorescent substance resin layer 28 containing a yellow fluorescent substance and a blue fluorescent substance. Also, at this time, first, the fluorescent substance paste is applied on the light guiding body layer 26 from the straight line portion to the upper branched portion by moving a dispenser nozzle at a speed of about 10 mm/sec. Then, the ejection of the fluorescent substance paste is stopped, and the dispenser is moved to the two-branch junction. The fluorescent substance paste is applied to cover the light guiding body layer 26 at the lower branched portion. Accordingly, the light guiding body layer 26 is sealed by the fluorescent substance resin layer 28 which has a cross-section formed in a hemispherical shape (a dome shape), and is molded in a substantially equal amount. Finally, while such a dome shape is maintained, the fluorescent substance resin layer 28 is cured through heat treatment for 1 h at 150° C.

The light guiding body layer 26 or the fluorescent substance resin layer 28 may be formed at one stroke through application by the dispenser. That is, when the dispenser nozzle is moved at the upper branch end, the dispenser which is ejecting the resin paste may be returned to the two-branch junction and then moved to the lower branched portion to apply the resin paste.

Thus, the light emitting module 20 in a two-dimensional emission shape which has emission line diverged from the vehicle body front portion 1A side to the vehicle body side portion 1B side is formed. The fluorescent substance resin layer 28 exhibits an elongation percentage of about 300% at a cured state, and has flexibility.

As illustrated in FIG. 3, a fixing plate 11 which has a support piece portion 11a formed by bending a lower end of the fixing plate 11 in a L-shape, and is formed of, for example, an aluminum plate having heat dissipation is disposed at required positions along the required streamlined shape in the horizontal direction within the lamp chamber. The light emitting module 20 is curved according to the streamlined shape, the rear surface of the light emitting module 20 is adhered on the fixing plate 11, and the support piece portion 11a is fixed to the bottom surface of the lamp body 2 through, for example, a screw 12. Accordingly, the light emitting module 20 is easily attached within the lamp chamber which is three-dimensionally formed to turn around along the vehicle shape.

Figure 5:
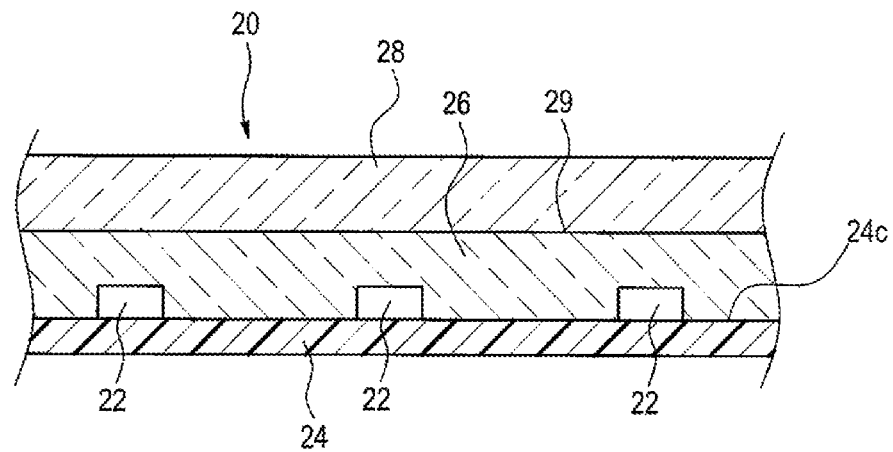
FIG. 5 is an exploded cross-sectional view of the light emitting module illustrated in FIG. 3 taken along line I-I.
Figure 6A:
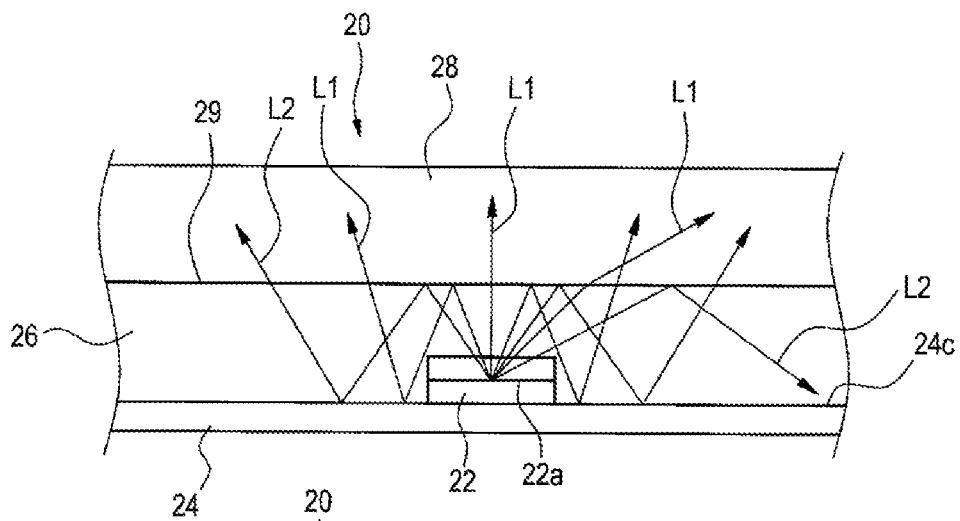
FIGS. 6A and 6B are exploded cross-sectional views illustrating a light emission state of a light emitting element provided in the light emitting module illustrated in FIG. 5.
Figure 6B:
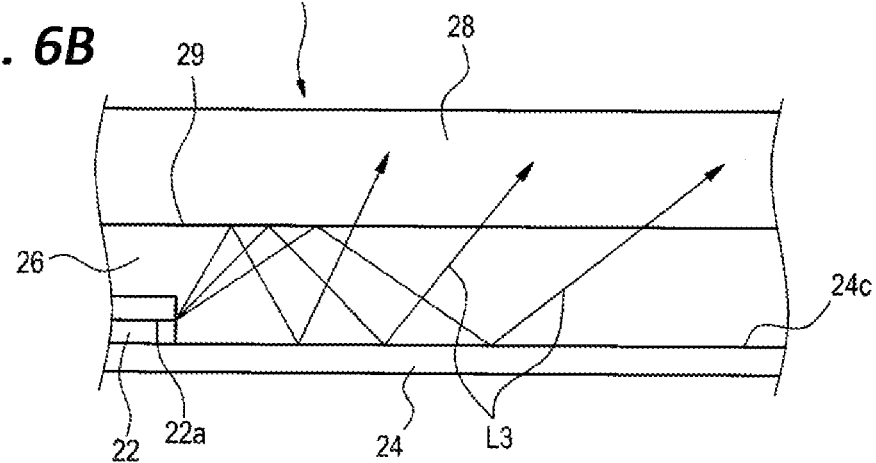

FIG. 5 is a horizontally cross-sectional view of the light emitting module 20 (cross-sectional view taken along line I-I in FIG. 3), and FIGS. 6A and 6B are partially exploded cross-sectional views illustrating the light emitting module 20 illustrated in FIG. 5. As illustrated in FIGS. 5, 6A and 6B, the configuration of the FPC 24 is simplified. In the above described light emitting module 20, when the light emitting element 22 is lit, as illustrated in FIG. 6A, one part (L) of lights emitted from a light emitting layer 22a of the light emitting element 22 toward the top surface of the light emitting element 22 (in the opposite direction to a direction toward a reflective surface 24c of the FPC 24) enters the fluorescent substance resin layer 28. The other part (L2) of the lights is reflected at an interface 29 between the light guiding body layer 26 that covers the light emitting element 22, and the fluorescent substance resin layer 28. The reflected light L2 is repeatedly reflected between the interface 29 and the reflective surface 24c so that it is guided to be spread around the light emitting element 22 within the light guiding body layer 26 in the horizontal direction of FIGS. 6A and 6B, and then dispersed in the fluorescent substance resin layer 28. By these lights L1 and L2, the fluorescent substance contained in the fluorescent substance resin layer 28 emits light and the whole of the fluorescent substance resin layer 28 substantially uniformly emits light to form two-dimensional light emission of which emission line is diverged from the vehicle body front portion side to the vehicle body side portion.

As described above, according to the present exemplary embodiment, the light emitted from the respective light emitting elements 22 is reflected at the interface 29 between the light guiding body layer 26 and the fluorescent substance resin layer 28 by the light guiding body layer 26 provided between the FPC 24 having the reflective surface 24c and the fluorescent substance resin layer 28, and thus may be diffused to be spread around the light emitting elements 22. As a result, the amount of light emitted from the respective light emitting elements 22 may become substantially uniform with the horizontal direction to enter the fluorescent substance resin layer 28. Thus, even though the interval between the light emitting elements 22 mounted in the light emitting module 20 is widened, substantially uniform light emission with a small contrast difference may be obtained.

According to the present exemplary embodiment, when the light guiding body layer 26 has a different refractive index from the fluorescent substance resin layer 28, the amount of the light L2 reflected at the interface 29 between the light guiding body layer 26 and the fluorescent substance resin layer 28 may be increased, thereby facilitating elimination of a contrast difference.

According to the present exemplary embodiment, when the light guiding body layer 26 is made of a material having a larger refractive index than the fluorescent substance resin layer 28, the refraction angle of the light L2 reflected at the interface 29 between the light guiding body layer 26 and the fluorescent substance resin layer 28 is expanded, thereby further facilitating elimination of a contrast difference.

According to the present exemplary embodiment, the light emitting element 22 is provided within the light guiding body layer 26. Thus, as illustrated in FIG. 6B, from among lights emitted from the light emitting layer 22a of the light emitting element 22, the light L3 emitted from the side surfaces of the light emitting element 22 as well as the lights L1 and L2 emitted toward the top surface of the light emitting element 22 may be guided within the light guiding body layer 26.

According to the present exemplary embodiment, the plurality of light emitting elements 22 are disposed in a predetermined two-dimensional shape, and are connected in line by the light guiding body layer 26 and the fluorescent substance resin layer 28 to be sealed. Thus, in the light emitting module 20 even in a complicated emission shape, substantially uniform light emission is achieved.

By simply applying the light guiding body layer 26 and the fluorescent substance resin layer 28 in a required emission shape through program control of the dispenser on the light emitting elements 22, line emission in a two-dimensionally complicated shape, that is, a new emission shape such as characters or figures may be easily achieved. The light guiding body layer 26 or the fluorescent substance resin layer 28 may be easily applied in a predetermined shape at one stroke. Since it is not necessary to combine single type light emitting modules to form light emission to be two-dimensionally diffused, a production cost is reduced.

The light emitting module 20 may take the same shape as the complicated three-dimensional streamlined shape of the vehicle body front portion 1A by freely integrally curving the light guiding body layer 26, the fluorescent substance resin layer 28 and the FPC 24 because not only the support substrate which is a wiring member of the light emitting elements 22 is formed of the FPC 24 with flexibility, but also the cured light guiding body layer 26 and the cured fluorescent substance resin layer 28 are flexible. Accordingly, when the light emitting module 20 capable of being freely curved is used, light emission may be easily formed even at a three-dimensional curved portion, such as the inside of the lamp chamber of the vehicle 1, to which it is difficult to arrange a conventional light emitting module formed by using a hard support substrate made of, for example, ceramic.

In a conventional light emitting module disclosed in WO Publication No. 2010/150459 in which the light of a light emitting element and the light of a fluorescent substance are synthesized, balance of color is varied according to a distance from the light emitting element due to thickness of the fluorescent substance, and thus line emission in uniform color is difficult. However, in the light emitting module 20, white light may be obtained by only light emission from the yellow fluorescent substance and the blue fluorescent substance, and light of a light source only contributes to light emission of the yellow fluorescent substance and the blue fluorescent substance. Thus, even though a complicated emission shape such as in the present exemplary embodiment is formed, light emission of uniform color with high luminous flux may be obtained.

(Second Exemplary Embodiment)

Figure 7:
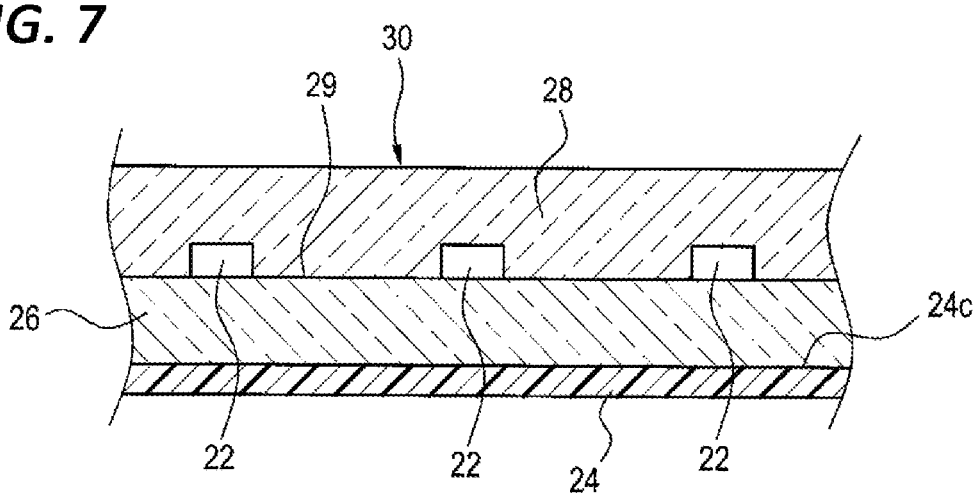
FIG. 7 is a partially exploded cross-sectional view of a light emitting module according to a second exemplary embodiment.

FIG. 7 is a partially exploded cross-sectional view illustrating a light emitting module 30 according to a second exemplary embodiment.

The light emitting module 30 in FIG. 7, as in the first exemplary embodiment, includes light emitting elements 22, an FPC 24, a light guiding body layer 26, and a fluorescent substance resin layer 28.

Each of the light emitting elements 22 according to the second exemplary embodiment is different from that of the first exemplary embodiment in that at least a part of the light emitting element 22 (the entire light emitting element 22 in FIG. 7) is located within the fluorescent substance resin layer 28. A method of forming the light emitting module 30 is as follows. First, the light guiding body layer 26 is formed by disposing a transparent member such as a transparent resin substrate on the FPC 24, and the light emitting elements 22 are mounted in a straight line with a predetermined interval on the top surface of the light guiding body layer 26. Then, a fluorescent substance paste of the fluorescent substance resin layer 28 containing a fluorescent substance is applied to cover the light emitting elements 22 mounted on the light guiding body layer 26, and the fluorescent substance paste is cured through heat treatment to form the fluorescent substance resin layer 28.

Figure 8:
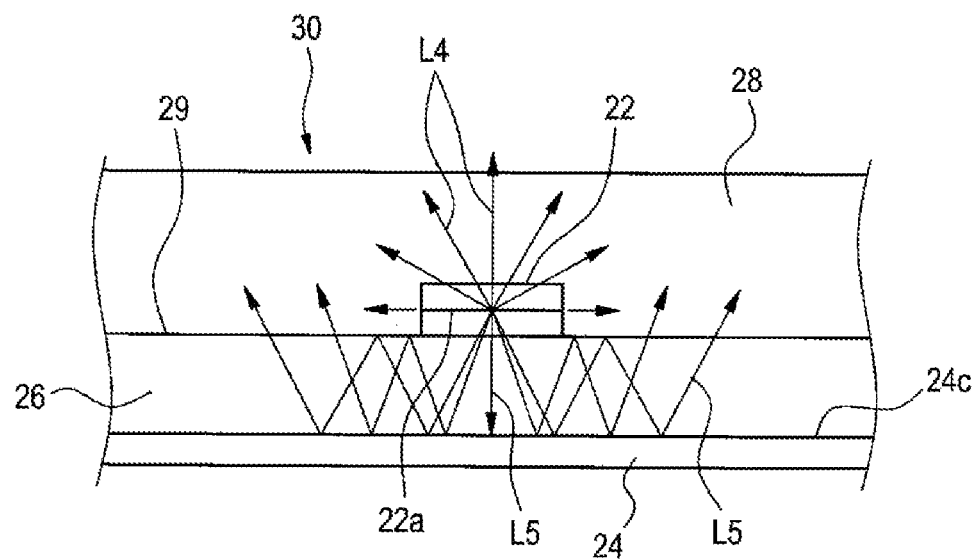
FIG. 8 is a cross-sectional view illustrating a light emission state of a light emitting element provided in the light emitting module illustrated in FIG. 7.

According to the present exemplary embodiment, the light emitting element 22 is located within the fluorescent substance resin layer 28 which is formed to be spaced apart from the FPC 24 through the light guiding body layer 26. Thus, as illustrated in FIG. 8, the lights emitted from a light emitting layer 22a of the light emitting element 22 are dispersed as a light L4 to directly enter the fluorescent substance resin layer 28, and a light L5 to be guided in the light guiding body layer 26 and then to enter the fluorescent substance resin layer 28, so that substantially uniform light emission of the light emitting module 30 may be achieved.

Figure 9:
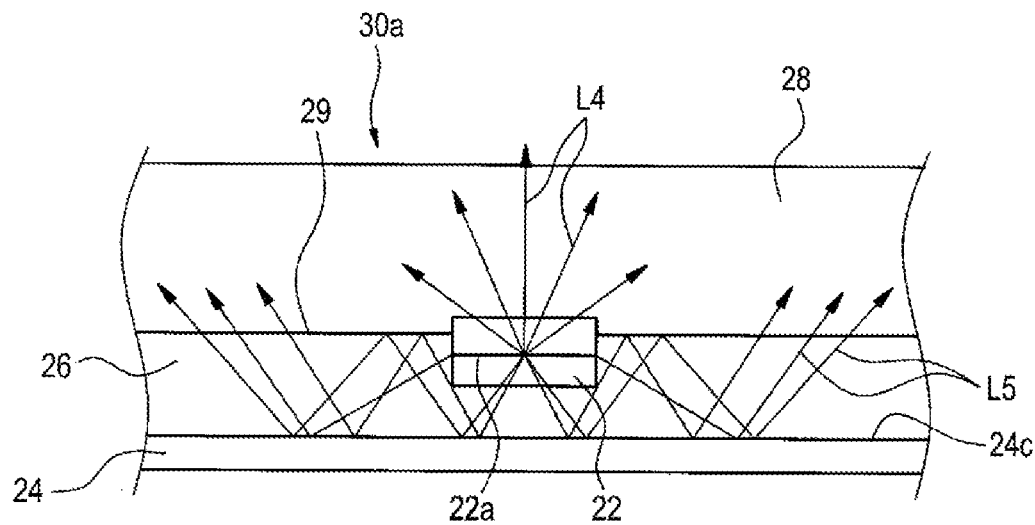
FIG. 9 is a partially exploded cross-sectional view of a light emitting module according to a modified example of the second exemplary embodiment.

In a modified example of the present exemplary embodiment, at least a part of the light emitting element 22 may be located within the fluorescent substance resin layer 28 as in a light emitting module 30a illustrated in FIG. 9. According to the configuration, from among the lights emitted from the light emitting layer 22a of the light emitting element 22, both the light emitted from the surface facing a reflective surface 24c and the light emitted from the side surface of the light emitting element enter the inside of the light guiding body layer 26, thereby increasing the amount of light to enter the light guiding body layer 26.

As described above, when the area of the light emitting element 22 to be located within the fluorescent substance resin layer 28 is changed by adjusting disposition of the light emitting element 22, it is possible to control the ratio of the light L4 to directly enter the fluorescent substance resin layer 28, and the light L5 to be guided within the light guiding body layer 26 and then to enter the fluorescent substance resin layer 28 from among the lights emitted from the light emitting element 22. This may further increase the substantially uniform light emission of the light emitting module 30a.

(Third Exemplary Embodiment)

Figure 10A:
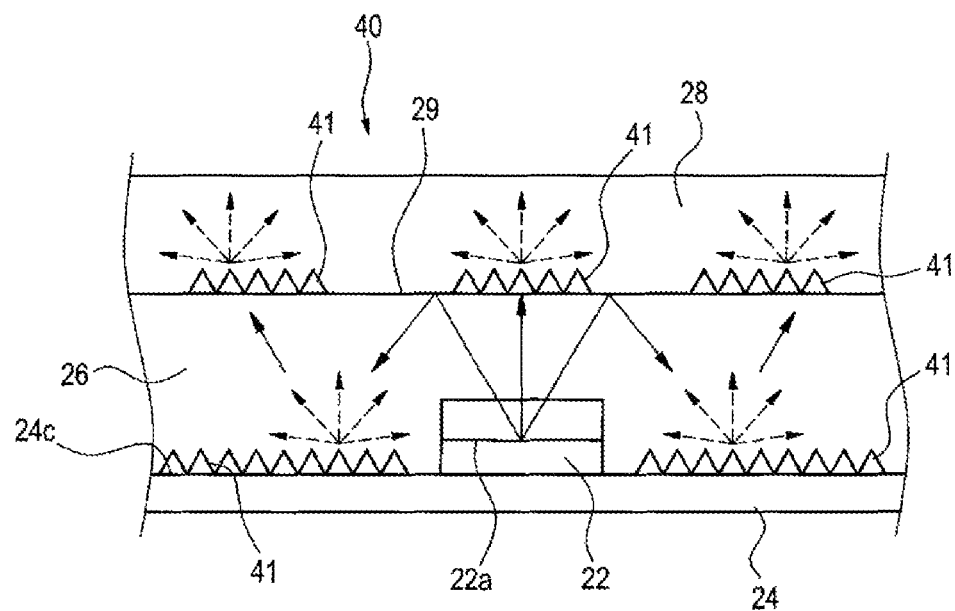
FIG. 10A is a partially exploded cross-sectional view of a light emitting module according to a third exemplary embodiment.

FIG. 10A is a partially exploded cross-sectional view of a light emitting module 40 according to a third exemplary embodiment.

In the same manner as in the first exemplary embodiment, a light emitting module 40 includes a light emitting element 22, an FPC 24, a light guiding body layer 26 and a fluorescent substance resin layer 28. The light emitting element 22 is located on a reflective surface 24c of the FPC 24. Scattering processing units 41 which are processed to scatter a part of a light emitted from the light emitting element 22 are provided on at least a part of the reflective surface 24c of the FPC 24 and an interface 29 between the light guiding body layer 26 and the fluorescent substance resin layer 28. The scattering processing units 41 may have been processed to be finely stepped in, for example, a hemispherical shape, an uneven shape, a trapezoidal shape or a cone shape. The scattering processing units 41 may be configured to be provided on at least one of the reflective surface 24c of the FPC 24 and the interface 29 between the light guiding body layer 26 and the fluorescent substance resin layer 28.

According to the present exemplary embodiment, since the scattering processing units 41 are provided, the light emitted from the light emitting element 22 may be further diffused to be spread around the light emitting element 22, and light control in the scattering processing units 41 is enabled.

Figure 10B:
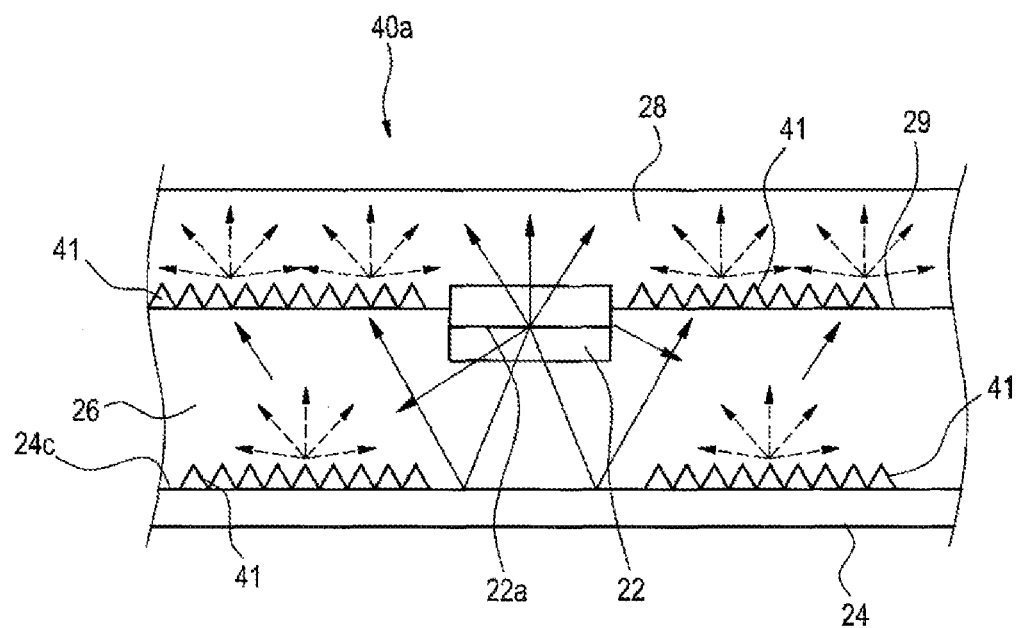
FIG. 10B is a partially exploded cross-sectional view a light emitting module according to a modified example of the third exemplary embodiment.

As in a light emitting module 40a illustrated in FIG. 10B, the light emitting element 22 may be located between the light guiding body layer 26 and the fluorescent substance resin layer 28. According to the configuration, it is possible to control the ratio of a light to directly enter the fluorescent substance resin layer 28, and a light to be guided within the light guiding body layer 26 and then to enter the fluorescent substance resin layer 28 from among the lights emitted from the light emitting element 22, and light control in the scattering processing units 41 is enabled.

(Fourth Exemplary Embodiment)

Figure 11:
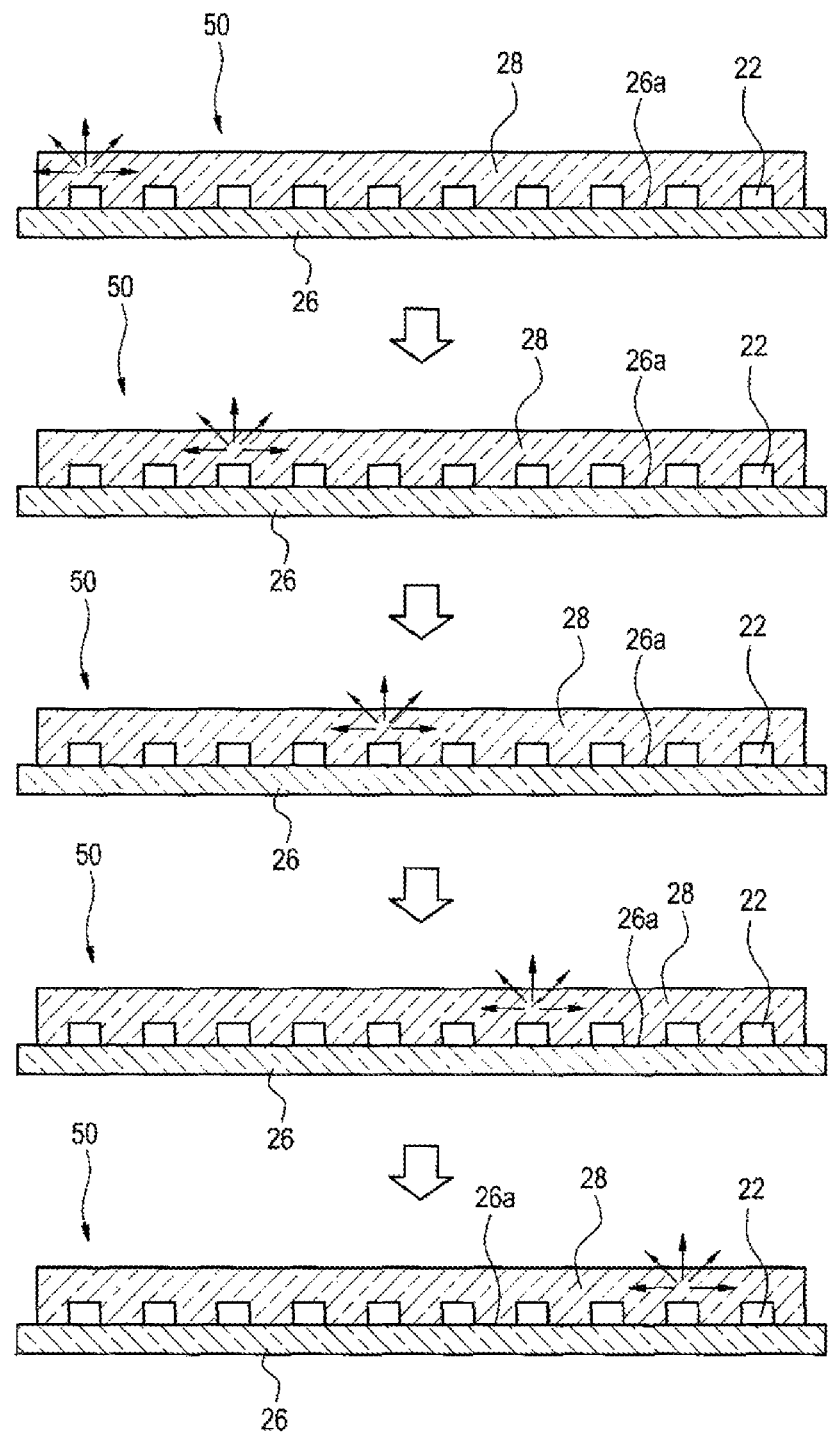
FIG. 11 is a cross-sectional view illustrating a sequential lighting state of a light emitting module according to a fourth exemplary embodiment.

FIG. 11 is a cross-sectional view illustrating a light emitting module 50 according to a fourth exemplary embodiment. As illustrated in FIG. 11, when the light emitting module 50 is lit, a sequential lighting may be performed to sequentially light linearly disposed light emitting elements 22 one by one or sequential groups of the light emitting elements 22. In the light emitting module 50, a FPC 24 is not provided, but a reflective surface 26a is provided on the bottom surface of a light guiding body layer (transparent resin substrate) 26. Accordingly, in the light emitting module 50, as in the first to third exemplary embodiments, substantially uniform light emission with a small contrast difference may be obtained.

In conventional light emitting elements, when sequential lighting is performed as in the present exemplary embodiment, a lighting position is clearly moved. Thus, a natural light emission pattern in which a lighting position seems to be gradually moved in a gradation form may not be achieved. Meanwhile, according to the present exemplary embodiment, the light emitted from the respective light emitting elements 22 is dispersed to be spread around the light emitting elements 22. Thus, even when the light emitting elements 22 are sequentially lit in the horizontal direction of FIG. 11, continuous smooth movement of a lighting position may be achieved, thereby providing a light emission pattern of a novel appearance.

(Fifth Exemplary Embodiment)

Figure 12:
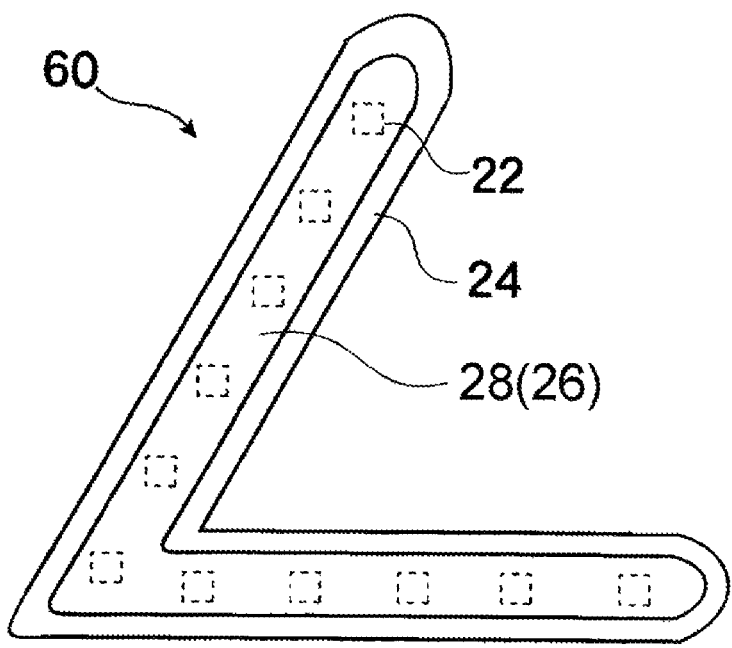
FIG. 12 is a front view of a light emitting module according to a fifth exemplary embodiment.

FIG. 12 is a front view of a light emitting module 60 according to a fifth exemplary embodiment. The light emitting module 60 may be formed in a required shape, for example, a substantially L shape as illustrated in FIG. 11. The light emitting module 60 may exhibit a function as a beacon light so as to be used as, for example, a DRL unit, a turn signal lamp unit, or a stop lamp unit. In the present exemplary embodiment, a configuration of disposing a plurality of light emitting modules 60 formed in a substantially L-shape in parallel may be employed. Here, by varying the kind of the fluorescent substance contained in the fluorescent substance resin layer 28 of each of the light emitting modules 60, emission color of each of the light emitting modules 60 may be varied. Accordingly, for example, it is possible to provide a group of light emitting modules of which one part of the light emitting modules 60 are configured as a turn signal lamp unit to emit light in amber or yellow, and the other part of the light emitting modules 60 are configured as a stop lamp unit to emit light in red, thereby enhancing the versatility as a vehicle lamp.

The light emitting module 60 is not limited to the substantially L-shape as illustrated in FIG. 12, but light emission of various characters or figures may be formed only by changing the setting of a dispenser. Accordingly, a vehicle lamp in a required shape may be easily formed.

(Sixth Exemplary Embodiment)

Figure 13:
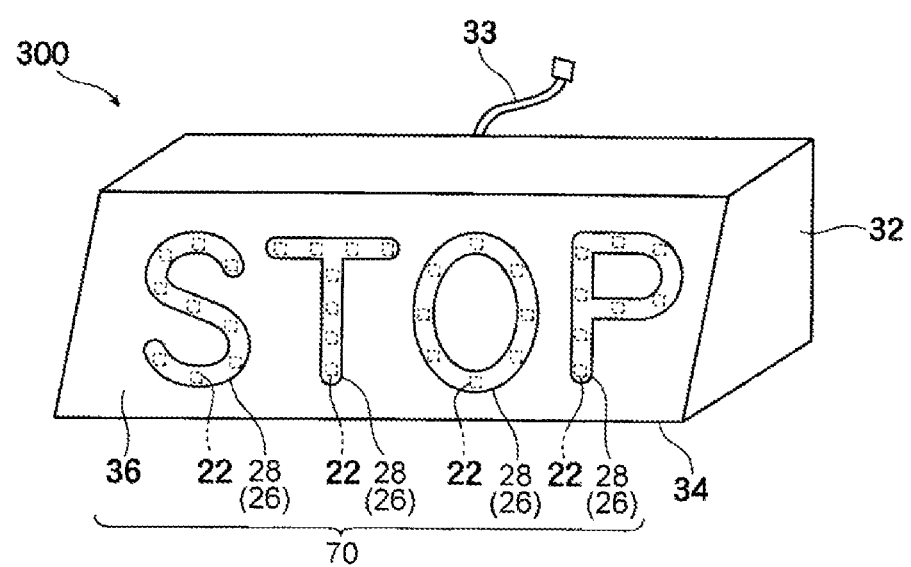
FIG. 13 is a perspective view of an HMSL formed of a light emitting module according to a sixth exemplary embodiment.

FIG. 13 is a perspective view of an HMSL formed of a light emitting module according to a sixth exemplary embodiment. In FIG. 13, the inside of a lamp chamber seen through a translucent cover 34 is indicated by a solid line.

An HMSL 300 in FIG. 13 includes a container-shaped case 32, the transparent translucent cover 34, and a light emitting module 70 arranged within a lamp chamber defined by the case 32 and the translucent cover 34. The HMSL 300 is fixed at the upper central portion inside the back window 6 through the case 32 by a conventionally known means such as a bolt and a nut.

The light emitting module 70 includes light emitting elements 22, a light guiding body layer 26, a fluorescent substance resin layer 28 containing a red fluorescent substance instead of a yellow fluorescent substance and a blue fluorescent substance, and a support substrate 36. As for the support substrate 36, for example, a rectangular aluminum nitride plate formed with an electrode pattern through gold deposition is employed. On the support substrate 36 (on the electrode pattern), the light emitting elements 22 are mounted in character shapes of "S", "T", "O", and "P" in the same manner as in the first exemplary embodiment, and the light guiding body layer 26 and the fluorescent substance resin layer 28 are applied on the character shapes of "S", "T", "O", and "P" to cover the light emitting elements 22 through program control of a dispenser in the same manner as in the first exemplary embodiment. Then, by screw-fixing the support substrate 36 to the case 32, the light emitting module 70 may be attached within the lamp chamber.

Each of the tail lamp, the stop lamp, the turn signal lamp and the backup of the RCL of the vehicle 1 is electrically connected to a battery (not illustrated) of the vehicle 1 by a group of independent switches such that when any one of the switches is turned ON, a corresponding lamp is lit. The HMSL 300 is configured such that current flows through a control circuit (not illustrated) provided within the case 32 to light the light emitting elements 22 when the control circuit is electrically connected to a wire harness (not illustrated) at the battery side of the vehicle 1 via a connector harness 33, and a switch for the stop lamp among the group of RCL switches is turned ON. That is, the HMSL 300 is lit in conjunction with the stop lamp of the RCL, and the fluorescent substance resin layer 28 of the light emitting module 70 uniformly emits light in red in a character shape of "STOP" with a high luminous flux.

In the light emitting module 70, the red fluorescent substance contained in the fluorescent substance resin layer 28 is represented by $(Ca_{1-x-y}Sr_x)AlSiN_3:Eu^{2+}_y$ (in which, x is in the range of $0 \leq x \leq 0.992$, and y is in the range of $0.001 \leq y \leq 0.015$) which emits visible light in red through wavelength conversion of near-UV rays or short wavelength visible light. There is no limitation in a material for the red fluorescent substance as long as the material allows red light to be obtained, and emitted light to have a peak wavelength in the wavelength region of 660 nm to 800 nm.

According to the present exemplary embodiment, the HMSL may be easily formed in a two-dimensionally diffused novel emission shape by the light emitting module 70, while the HMSL conventionally generally has had a plurality of LEDs emitting visible light in a linearly (one-dimensionally) lined emission shape. Further, since uniform light emission with a high luminous flux may be obtained, it is possible to provide an HMSL excellent in visibility by the following vehicle.

The shape of the light emitting module 70 is not limited to the shape of "STOP", but light emission of various characters or figures may be formed only by changing the setting of a dispenser. Accordingly, for example, a light emitting module may be formed by the light emitting elements 22 arranged in shapes of "right" and "left" and connected in line by the light guiding body layer 26 and the fluorescent substance resin layer 28, and then a vehicle lamp in conjunction with lighting of the turn signal lamp of the RCL may be easily formed.

In the present exemplary embodiment, when an FPC is used as for the support substrate 36, the light emitting module 70 may be freely flexed along the back window 6 and thus easily arranged even in a case where the back window 6 of the vehicle 1 is curved in its specification.

(Seventh Exemplary Embodiment)

Figure 14:
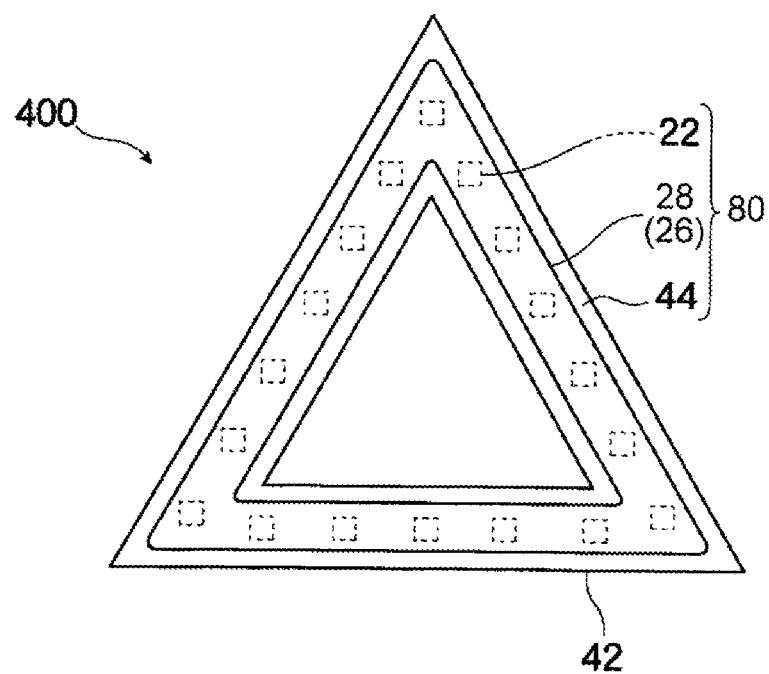
FIG. 14 is a front view of a triangular display panel formed of a light emitting module according to a seventh exemplary embodiment.

FIG. 14 is a front view illustrating a triangular display panel formed of a light emitting module according to a seventh exemplary embodiment. In FIG. 14, the inside of a lamp chamber seen through a translucent cover 42 is indicated by a solid line.

A triangular display panel 400 in FIG. 14 is a triangular framed mechanism used at the time of emergency stop of the vehicle 1, and includes a light emitting module 80, and the triangular framed transparent translucent cover 42 configured to protect the front surface of the light emitting module 80 as in the sixth exemplary embodiment. The light emitting module 80 includes light emitting elements 22, a light guiding body layer 26, a fluorescent substance resin layer 28 containing a yellow fluorescent substance and a blue fluorescent substance, and a support substrate 44 as in the first exemplary embodiment. As for the support substrate 44, for example, a triangular framed aluminum nitride plate which is formed with an electrode pattern through gold deposition and has another mirror-like polished surface besides the electrode pattern is employed.

In the fluorescent substance resin layer 28 of the light emitting module 80, instead of a yellow fluorescent substance and a blue fluorescent substance, a red fluorescent substance which emits visible light in red through wavelength conversion of near UV rays or short wavelength visible light and is represented by $(Ca_{1-x-y}Sr_x)AlSiN_3:Eu^{2+}_y$ (in which, x is in the range of $0 \leq x \leq 0.992$, and y is in the range of $0.001 \leq y \leq 0.015$) is mixed. There is no limitation in a material for the red fluorescent substance as long as the material allows red light to be obtained, and emitted light to have a peak wavelength in the wavelength region of 660 nm to 800 nm.

In the light emitting module 80, on the support substrate 44, the same light emitting elements 22 as those in the first exemplary embodiment are triangularly mounted in the same manner as in the first exemplary embodiment, and the light guiding body layer 26 and the fluorescent substance resin layer 28 containing the red fluorescent substance are applied in the figure shape of "Δ" to cover the light emitting elements 22 through program control of a dispenser.

The triangular display panel 400 is configured to be fed from a certain external power source provided at the rear surface of the support substrate 44 or to be fed from a battery of the vehicle 1 when mounted to the rear surface of a trunk lid of the vehicle 1. Accordingly, the light emitting elements 22 are lit, and the light emitting module 80 ['s the fluorescent substance resin layer 28] uniformly emits light in red in a figure shape of "Δ" with a high luminous flux. According to the present exemplary embodiment, it is possible to obtain uniform light emission with a high luminous flux by the light emitting module 80, as compared to in a display panel employing a conventional red reflecting plate. Thus, it is possible to provide a triangular display panel excellent in visibility.

The shape of the light emitting module 80 is not limited to the figure shape of "Δ", but light emission of various characters or figures may be formed only by changing the setting of a dispenser. Accordingly, for example, a light emitting module may be formed by the light emitting elements 22 arranged in a figure shape of "□" and connected in line by the light guiding body layer 26 and the fluorescent substance resin layer 28, and then an indicating lamp or a lighting lamp to be provided to, for example, a road may be easily formed of the light emitting module.

In the light emitting modules 70 and 80 of the sixth and seventh exemplary embodiments, the yellow fluorescent substance and the blue fluorescent substance of the first exemplary embodiment may be used to configure a vehicle lamp or an indicating lamp to emit light in white.

In the beacon light 200 of the first exemplary embodiment or the HMSL 300 of the sixth exemplary embodiment, when the fluorescent substance resin layer 28 further contains a red fluorescent substance in addition to the yellow fluorescent substance and the blue fluorescent substance, a wavelength region of red is complemented so as to provide a vehicle lamp or an indicating lamp that emits light in white with a color rendering property.

(Eighth Exemplary Embodiment)

Figure 15:
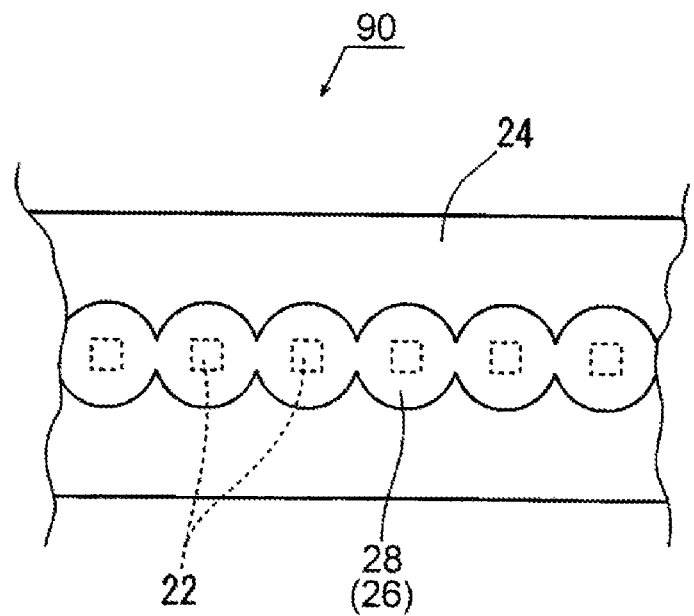
FIG. 15 is a plan view illustrating a light emitting module according to an eighth exemplary embodiment.

In the eighth exemplary embodiment, as illustrated in FIG. 15, a light emitting module 90 is configured by sequentially forming a light guiding body layer 26 and a fluorescent substance resin layer 28 which are formed in a domed lens shape. In the present exemplary embodiment, the same components as those in the first exemplary embodiment to the seventh exemplary embodiment are given the same reference numerals, and the description thereof is omitted.

In the beacon light 200, a lens or a reflector besides a light emitting module has been often used in order to achieve light distribution in accordance with standards such as SAE J2087 AUG91 or ECE87. However, the inventor of the present disclosure has found that the fluorescent substance resin layer 28 may be applied in a lens shape when the viscosity of the fluorescent substance resin layer 28 is adjusted to range from 1 Pa·s to 500 Pa·s, the coating pressure to be applied to inside of a syringe at the time of coating (potting) of the fluorescent substance resin layer 28 is adjusted to range from 1 kPa to 50 kPa, the ejection port diameter of the syringe is adjusted to range from 0.1 mm to 2.5 mm, and the dispenser nozzle movement speed is adjusted to range from 0 mm/s to 100 mm/s. More specifically, the viscosity of the fluorescent substance resin layer 28 is adjusted to be 100 Pa·s, the coating pressure to be applied to inside of the syringe at the time of coating of the fluorescent substance resin layer 28 is adjusted to 50 kPa, and the ejection port diameter of the syringe is adjusted to 1.43 mm. Then, after the fluorescent substance resin layer 28 is applied at a dispenser nozzle movement speed of 0 mm/s (stop), the dispenser nozzle is moved by about 8 mm, and at the moved position, the fluorescent substance resin layer 28 is applied. By repeatedly performing this process, a line light source in which domed lens shapes are connected to each other may be obtained. The light guiding body layer 26 may be formed in the same manner to be applied in a lens shape.

The light emitting module 90 has a lens function. Thus, when the light emitting module 90 is used as a light source for the beacon light 200, no lens besides the light emitting module 90 is required, or the beacon light 200 may be largely simplified, thereby reducing the cost.

(Ninth Exemplary Embodiment)

Figure 16:
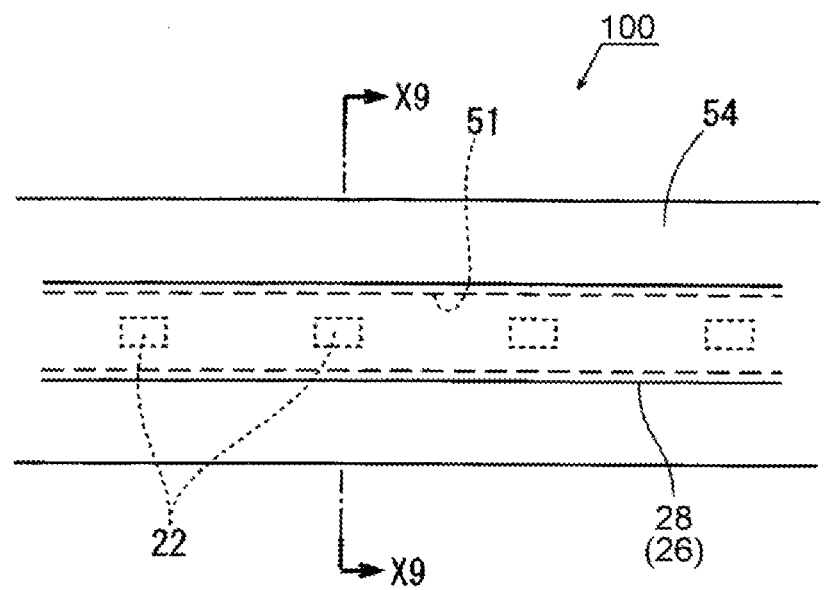
FIG. 16 is a plan view illustrating a light emitting module according to a ninth exemplary embodiment.
Figure 17:
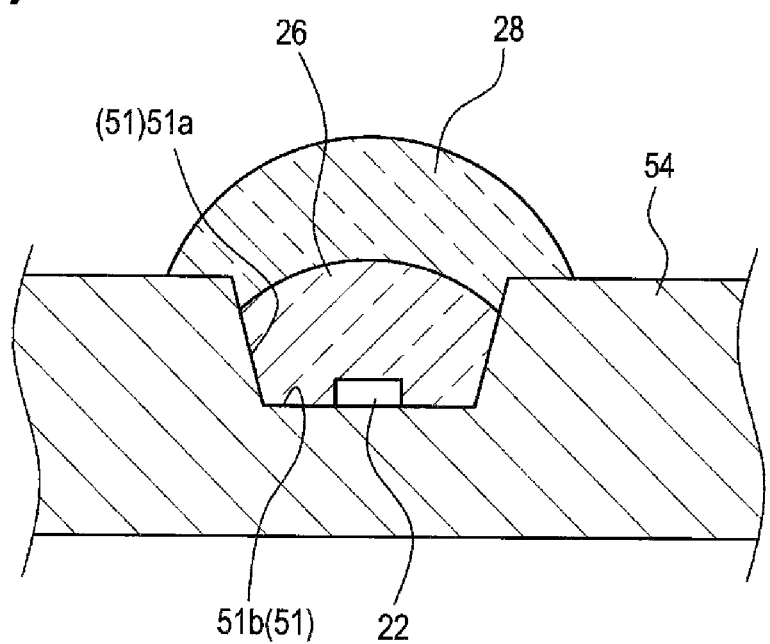
FIG. 17 is an exploded cross-sectional view taken along line X9-X9 in FIG. 16.

FIGS. 16 and 17 illustrate a light emitting module 100 according to a ninth exemplary embodiment in which a reflector is formed on a support substrate 54 formed of, for example, an aluminum substrate.

In the ninth exemplary embodiment, a groove 51 is formed on the surface of the support substrate 54 as illustrated in FIG. 17. Inner surfaces 51a on the opposite side walls of the groove 51 are inclined to be gradually spaced apart from each other from a bottom surface 51b to the opening, and light emitting elements 22 are mounted (disposed) at a predetermined interval on the bottom surface 51b within the groove 51. A light guiding body layer 26 is applied within the groove 51 and on the light emitting elements 22. A fluorescent substance resin layer 28 is formed in an arc shape on the groove 51 of the support substrate 54. Accordingly, the inner surfaces 51a on the opposite side walls of the groove 51 have a light distribution control function by the reflector. When the light emitting module 100 is used as a light source for the beacon light 200, no reflector besides the light emitting module 100 is required, or the beacon light 200 may be largely simplified, thereby reducing the cost.

Figure 18:
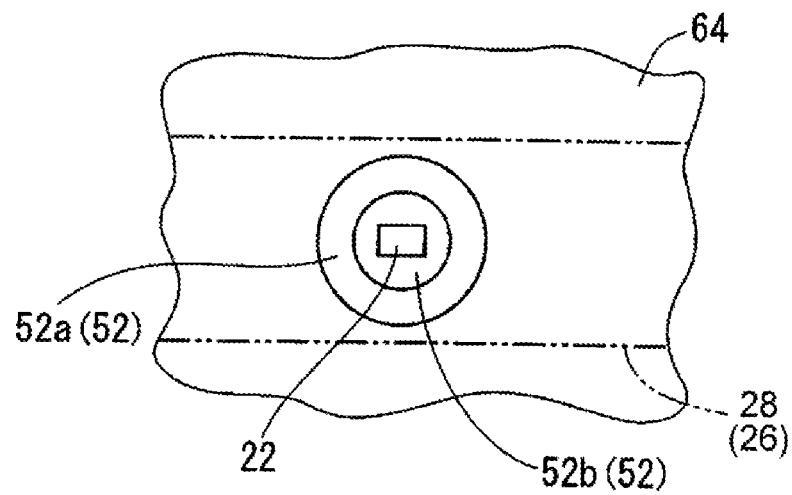
FIG. 18 is a plan view partially illustrating a light emitting module according to a modified example of the ninth exemplary embodiment.

FIG. 18 illustrates a modified example of the ninth exemplary embodiment.

In the present modified example, a recess 52 is individually formed at a disposition position of each of the light emitting elements 22 on a support substrate 64 formed of, for example, an aluminum substrate, and the light emitting element 22 is disposed on a bottom surface 52b of the recess 52. In this case, the opening of each recess 52 is formed in a round shape when viewed from the plan view, and the recess 52 has a diameter gradually decreasing toward the inside of the support substrate 64 in the thickness direction, and has an inner peripheral surface 52a having a function as a reflector based on a diameter decrease structure of the recess 52.

Figure 19:
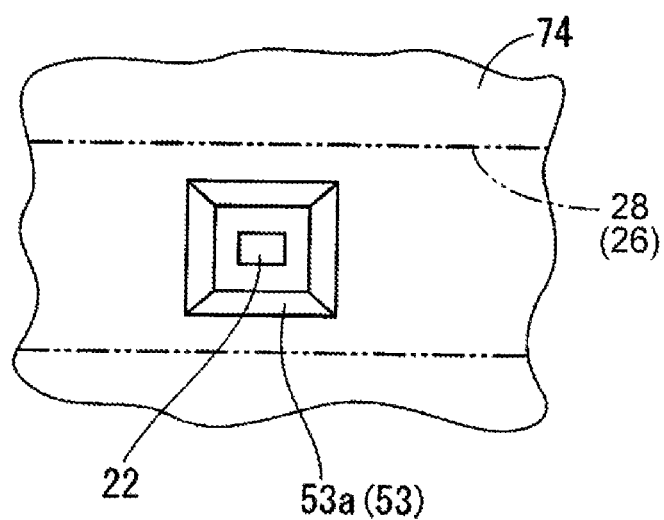
FIG. 19 is a plan view partially illustrating a light emitting module according to another modified example of the ninth exemplary embodiment.

FIG. 19 illustrates another modified example of the ninth exemplary embodiment.

In the present modified example, a recess 53 is individually formed in a quadrangular shape when viewed from the plan view on a support substrate 74 formed of, for example, an aluminum substrate. Opposite inner surfaces 53a hanging down from the opening side of each recess 53 are inclined to approach each other according to hanging-down from the opening side of the recess 53. Accordingly, in the present modified example, the inner surfaces 53a hanging down from the opening side of each recess 53 have a function as a reflector.

Figure 20:
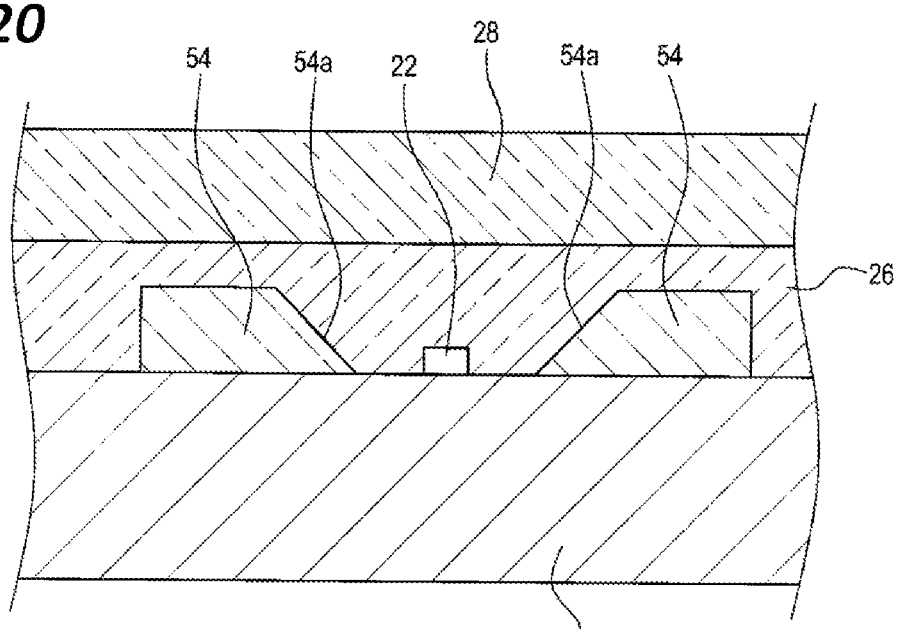
FIG. 20 is a vertically cross-sectional view partially illustrating a light emitting module according to a further modified example of the ninth exemplary embodiment.

FIG. 20 illustrates a further modified example of the ninth exemplary embodiment.

In the present modified example, a couple of raised portions 54 are provided on a support substrate 84. The couple of raised portions 54 are disposed to form a groove therebetween, and the respective light emitting elements 22 are disposed on the support substrate 84 between the couple of raised portions 54. Inner surfaces 54a of the couple of raised portions 54 are inclined to be gradually spaced apart from each other toward the outside of the support substrate 84 in the thickness direction, and the two inclined inner surface 54a are configured to have a function as a reflector based on a material such as, for example, aluminum of the raised portions 54.

In this case, instead of a groove formed by the couple of raised portions 54, a recess may be individually formed for each light emitting element 22 by the raised portion 54 and the light emitting element 22 may be individually disposed within the recess.

Exemplary embodiments have been described, but the present disclosure includes following aspects.

(1) A method of forming the light guiding body layer 26 and the fluorescent substance resin layer 28 is not limited to application by a dispenser, but other molding methods such as a printing method, an injection molding, or a compression molding may be used.

(2) In the above described exemplary embodiments, the FPC 24 is often made of a resin such as epoxy, or a metal such as aluminum, or copper, but may be made of other materials.

(3) According to the shape of the beacon light 200, instead of the FPC 24, a substrate with a low flexibility, for example, a thick glass epoxy substrate, a metal substrate made of aluminum or copper, or a ceramic substrate may be used.

(4) In order to secure flexibility, the FPC 24 and the substrate with a low flexibility as mentioned in (3) may be used in combination.

Figure 21:
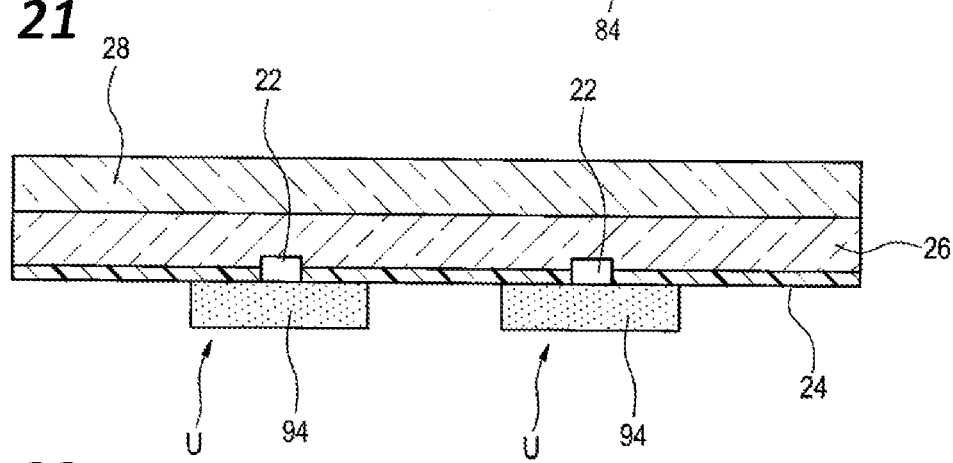
FIG. 21 is an explanatory view illustrating an example of using an FPC and a substrate with a low flexibility in combination.
Figure 22:
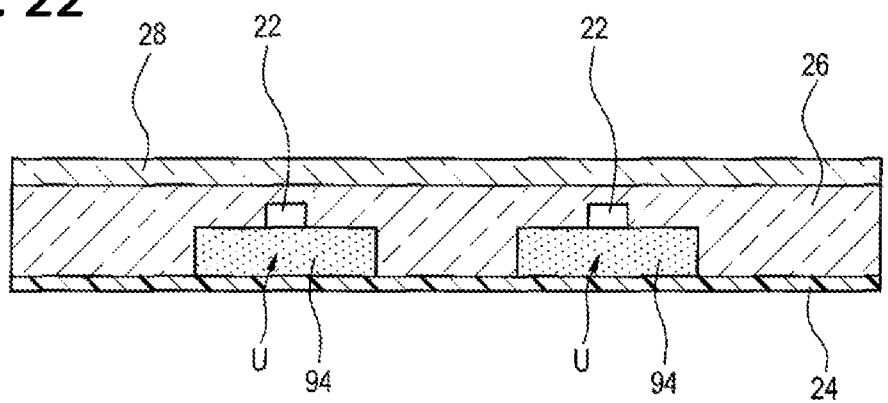
FIG. 22 is an explanatory view illustrating another example of using an FPC and a substrate with a low flexibility in combination.

Specifically, as illustrated in FIGS. 21 and 22, it is desirable that a unit U having the light emitting element 22 mounted on a substrate 94 with a low flexibility is prepared, and such units U are attached with an interval on the FPC 24. That is, as illustrated in FIG. 21, the substrate with a low flexibility 94 of each unit U may be attached on one surface (bottom surface in FIG. 21) of the FPC 24, and the light emitting element 22 may penetrate the FPC 24 to protrude at the other surface of the FPC 24 (top surface in FIG. 21), such that the light emitting element 22 is covered with the light guiding body layer 26 and the fluorescent substance resin layer 28. Otherwise, as illustrated in FIG. 22, the unit U having the light emitting element 22 mounted on the substrate 94 with a low flexibility may be attached on the other surface of the FPC 24 (top surface in FIG. 22), and may be covered with the light guiding body layer 26 and the fluorescent substance resin layer 28.

(5) In order to satisfy SAE standard (SAE J2087 AUG91) and ECE standard (ECE R87) of the beacon light 200, the emission luminous flux of the light emitting module 20 is set to range from 200 lm to 1200 lm.

Thus, in the light emitting module 20, a current ranging from 500 mA to 3000 mA flows in the plurality of light emitting elements 22 in order to obtain the emission luminous flux.

(6) An appropriate interval with which the plurality of light emitting elements 22 are placed is varied according to a value of current to be flowed in one light emitting element 22.

Specifically, the relationship between the interval of the light emitting elements 22 and the optimal value of the current to be flowed may be set to be as follows.

At an interval of 0.5 mm to 5 mm, 10 mA to 30 mA.
At an interval of 3 mm to 20 mm, 20 mA to 300 mA.
At an interval of 10 mm to 50 mm, 100 mA to 1000 mA.
At an interval of 30 mm to 100 mm, 300 mA to 1500 mA.

More specifically, the interval between the light emitting elements 22 may be set to be 8 mm when the value of current to be flowed in the light emitting element 22 is 100 mA. This is because when the plurality of light emitting elements 22 have a wider interval than the above described appropriate interval, a bright region and a dark region occur in the light emitting module 20, thereby suppressing uniform light emission, and when they have a narrower interval than the appropriate interval, the number of the light emitting elements 22 is unnecessarily increased, thereby increasing the cost.

(7) When the beacon light 200 is required to satisfy the luminous flux condition in (5) and to have various lengths in design, the light emitting module 20 with various lengths may be achieved by varying the interval with which of the plurality of light emitting elements 22 are placed and the value of current to be flowed in one light emitting element 22.

Specifically, the length of the light emitting module 20 for the beacon light 200 may have a following correspondent relationship with respect to the relationship of the interval between the light emitting elements 22, and the optimal value of the current to be flowed.

When the interval between the light emitting elements 22 ranges from 0.5 mm to 5 mm, and the optimal current value ranges from 10 mA to 30 mA, the light emitting module 20 has a length ranging from 8 mm to 1500 mm.

When the interval between the light emitting elements 22 ranges from 3 mm to 20 mm and the optimal current value ranges from 20 mA to 300 mA, the light emitting module 20 has a length ranging from 3 mm to 3000 mm.

When the interval between the light emitting elements 22 ranges from 10 mm to 50 mm and the optimal current value ranges from 100 mA to 1000 mA, the light emitting module 20 has a length ranging from 10 mm to 1500 mm.

When the interval between the light emitting elements 22 ranges from 30 mm to 100 mm and the optimal current value ranges from 300 mA to 1500 mA, the light emitting module 20 has a length ranging from 30 mm to 1000 mm.

Accordingly, the beacon light 200 may freely have lengths adaptable to a wide range of designs.

More specifically, for example, when the light emitting module 20 for the beacon light 200 requires a luminous flux of 200 lm and a length of 200 mm, the placement interval between the light emitting elements 22 may be set to be 8.3 mm, the value of current to be flowed in one light emitting element 22 may be set to be 40 mA, and 24 light emitting elements 22 may be placed to achieve the requirements.

(8) In the fluorescent substance resin layer 28 applied to have a hemispherical (domed) cross-section, a proper value of a coating width is set to range from the width of the light emitting element 22 to 20 mm, and a proper value of a coating height is set to range from 0.5 times to 3 times the coating width.

This is because when the coating width or the coating height is greater than the proper value, the efficiency when the light emitted from the inside of the fluorescent substance resin layer 28 comes out is deteriorated, thereby lowering the efficiency of the light emitting module 20, and on the other hand when the coating width or the coating height is smaller than the proper value, it becomes difficult to completely cover the light emitting element 22, thereby making it difficult to manufacture the light emitting module 20.

(9) A method of fixing the light emitting module 20 to the fixing plate 11 is not limited to adhesion, but other methods such as screw fastening, caulking, suppression by other parts may be used.

(10) The fixing plate 11 may be made of materials such as iron, copper, or ceramic other than aluminum.

(11) A heat transfer member such as a heat pipe, a water-cooling unit or a peltier element may be provided in the fixing plate 11 to increasing a heat dissipation performance.

(12) A chip on board may be employed in which the light emitting elements 22 are directly mounted on the fixing plate 11, and the mounted light emitting elements 22 are sealed by the light guiding body layer 26 and the fluorescent substance resin layer 28.

Accordingly, a substrate such as the FPC 24 becomes necessary, thereby reducing the cost.

(13) As a driving voltage for the beacon light 200, a battery voltage 12 V, 24 V of a vehicle, or a voltage obtained by converting the battery voltage of the vehicle into a required value through a DC-DC converter may be used.

Here, wiring of the light emitting elements 22 is based on a series connection of a number equal to or less than [driving voltage/voltage of light emitting element 22]. Further, since a current limit is required, in a case where the DC-DC converter having a function of the current limit is not used, an additional current limiting power circuit such as a resistor, a transistor, an FET, or a constant current diode is used.

Hereinbefore, the present disclosure is described in detail based on the specific exemplary embodiments. A person skilled in the related art will appreciate that various modifications or changes may be made without departing from the spirit and scope of the present disclosure.

For example, the support substrate on which the reflective surface is provided is not limited to the FPC 24, but a substrate with a low flexibility, for example, a thick glass epoxy substrate, a metal substrate made of aluminum or copper, or a ceramic substrate may be used. In order to secure flexibility, the FPC 24 and the substrate with a low flexibility may be combined.

As the light guiding body layer 26, instead of the transparent resin paste, a transparent resin substrate made of polycarbonate or acryl resin may be used. In this case, the light emitting element 22 may be provided such that the bottom surface of the light emitting element 22 is exposed at one surface of the transparent resin substrate (e.g., bottom surface of the light guiding body layer 26 in FIG. 5), and the transparent resin substrate may be adhered on the FPC 24 such that the surface of the transparent resin substrate at which the light emitting element 22 is exposed faces the reflective surface 24c of the FPC 24. Then, the fluorescent substance resin layer 28 may be provided on the top surface of the transparent resin substrate to form the light emitting module of the present exemplary embodiment.

In the above described exemplary embodiments, the thickness of the fluorescent substance resin layer 28 is fixed, but the present disclosure is not limited to the example. The thickness of the fluorescent substance resin layer 28 may be varied to be uneven so that a novel appearance of light emission pattern with a stereoscopic effect may be achieved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A light emitting module comprising:
   a plurality of light emitting elements;
   a fluorescent substance resin layer containing a fluorescent substance which is excited by light emitted from the plurality of light emitting elements to emit visible light;
   a reflective surface configured to reflect light emitted from the plurality of light emitting elements and the fluorescent substance resin layer;
   a light guiding body layer provided between the reflective surface and the fluorescent substance resin layer, and configured to guide light emitted from the plurality of light emitting elements or the fluorescent substance; and
   a scattering processing unit provided on at least one of the reflective surface and an interface between the fluorescent substance resin layer and the light guiding body layer, the scattering processing unit being configured to scatter a part of the light emitted from the plurality of light emitting elements and stepped in at least one of a hemispherical shape, an uneven shape, a trapezoidal shape, and a cone shape,
   wherein the fluorescent substance of the fluorescent substance resin layer includes a yellow fluorescent substance and a blue fluorescent substance.

2. The light emitting module of claim 1, wherein the light guiding body layer has a different refractive index from the fluorescent substance resin layer.

3. The light emitting module of claim 2, wherein the light guiding body layer is made of a material having a higher refractive index than the fluorescent substance resin layer.

4. The light emitting module of claim 1, wherein the plurality of light emitting elements are provided within the light guiding body layer.

5. The light emitting module of claim 2, wherein the plurality of light emitting elements are provided within the light guiding body layer.

6. The light emitting module of claim 3, wherein the plurality of light emitting elements are provided within the light guiding body layer.

7. The light emitting module of claim 1, wherein at least a part of each of the plurality of light emitting elements is positioned within the fluorescent substance resin layer.

8. The light emitting module of claim 2, wherein at least a part of each of the plurality of light emitting elements is positioned within the fluorescent substance resin layer.

9. The light emitting module of claim 3, wherein at least a part of each of the plurality of light emitting elements is positioned within the fluorescent substance resin layer.

10. The light emitting module of claim 1, wherein the plurality of light emitting elements are disposed in a predetermined two-dimensional shape, and are formed to be connected in line by at least one of the fluorescent substance resin layer and the light guiding body layer.

11. The light emitting module of claim 2, wherein the plurality of light emitting elements are disposed in a predetermined two-dimensional shape, and are formed to be connected in line by at least one of the fluorescent substance resin layer and the light guiding body layer.

12. The light emitting module of claim 3, wherein the plurality of light emitting elements are disposed in a predetermined two-dimensional shape, and are formed to be connected in line by at least one of the fluorescent substance resin layer and the light guiding body layer.

13. The light emitting module of claim 1, wherein the fluorescent substance resin layer is formed as a fluorescent substance paste, by mixing the yellow fluorescent substance and the blue fluorescent substance with each other in a weight ratio 2:1, and mixing a mixed fluorescent substance in an amount of 1.8 vol % with a binder material made of a liquid or gel silicon resin.

* * * * *